(12) United States Patent
Joshi

(10) Patent No.: US 10,271,467 B2
(45) Date of Patent: Apr. 23, 2019

(54) SYSTEMS AND METHODS FOR FLUX CANCELATION IN ELECTRONIC DEVICES

(71) Applicant: Prasad S. Joshi, Irvine, CA (US)

(72) Inventor: Prasad S. Joshi, Irvine, CA (US)

(*) Notice: Subject to any disclaimer, the term of this patent is extended or adjusted under 35 U.S.C. 154(b) by 0 days.

(21) Appl. No.: 15/965,766

(22) Filed: Apr. 27, 2018

(65) Prior Publication Data

US 2018/0249602 A1    Aug. 30, 2018

Related U.S. Application Data

(63) Continuation-in-part of application No. 15/089,590, filed on Apr. 4, 2016, now abandoned.

(51) Int. Cl.
*H02J 50/70* (2016.01)
*H02J 50/10* (2016.01)
(Continued)

(52) U.S. Cl.
CPC ......... *H05K 9/0071* (2013.01); *G01R 33/025* (2013.01); *G01R 33/07* (2013.01);
(Continued)

(58) Field of Classification Search
CPC ........ H05K 9/0071; H02J 7/0025; H02J 7/50; H02J 7/70; H02J 7/10; G01R 33/07;
(Continued)

(56) References Cited

U.S. PATENT DOCUMENTS 3,611,098 A * 10/1971 Fair ................... H02P 7/298
318/257
3,706,025 A    12/1972 Regat
(Continued)

FOREIGN PATENT DOCUMENTS

JP    08214473 A    8/1996
JP    11189157 A    7/1999
(Continued)

OTHER PUBLICATIONS

Kuniyoshi et al., English Machine Translation of Japanese Patent Document No. JP-2018-017687, Publish on Feb. 1, 2018, Machine Translated via JPO website, on Dec. 9, 2018, 10 pages. (Year: 2018).*

*Primary Examiner* — Phallaka Kik
(74) *Attorney, Agent, or Firm* — Cionca IP Law P.C.; Marin Cionca

(57) ABSTRACT

A method of performing active shielding of an electronic device from a magnetic field having a first flux, using a circuit; having the steps of: measuring, using a Hall effect sensor, a first magnitude and a first direction of the first flux; creating an output voltage equal to the first magnitude; feeding the output voltage to a differential amplifier; amplifying the output voltage to create an amplified output; comparing, using an error amplifier, the amplified output to a reference voltage to determine an error voltage; feeding the error voltage to an electric power switching circuit; generating a switching waveform based on the error voltage; feeding the switching waveform as an input to a driver module; creating, based on the input, a current having amplitude equaling the first magnitude and a second direction opposite of the first direction, such that a second flux is created to cancel the first flux.

20 Claims, 6 Drawing Sheets

(51) Int. Cl.
*H05K 9/00* (2006.01)
*G01R 33/07* (2006.01)
*H04B 5/00* (2006.01)
*H01L 25/00* (2006.01)
*H01L 29/82* (2006.01)
*H01L 23/58* (2006.01)
*H02J 7/02* (2016.01)
*G01R 33/025* (2006.01)

(52) U.S. Cl.
CPC .............. *H02J 7/025* (2013.01); *H02J 50/10* (2016.02); *H02J 50/70* (2016.02); *H04B 5/0037* (2013.01); *H04B 5/0081* (2013.01); *H01L 23/58* (2013.01); *H01L 25/00* (2013.01); *H01L 29/82* (2013.01)

(58) Field of Classification Search
CPC .............. G01R 33/0025; H04B 5/0037; H04B 5/0081; H01L 29/82; H01L 23/58; H01L 25/00
USPC .............. 320/108, 109; 326/21, 41, 47, 101; 257/422, 423, 798
See application file for complete search history.

(56) References Cited

U.S. PATENT DOCUMENTS

| | | | |
|---|---|---|---|
| 4,030,026 A | 6/1977 | Payne | |
| 5,578,767 A * | 11/1996 | Chikaraishi | G01L 3/101 73/862.331 |
| 5,739,616 A * | 4/1998 | Chikaraishi | G01L 3/105 310/166 |
| 7,498,804 B1 | 3/2009 | Li et al. | |
| 9,551,762 B1 * | 1/2017 | Cesaretti | G01R 33/0035 |
| 2003/0155912 A1* | 8/2003 | Motz | G01R 33/07 324/225 |
| 2009/0001981 A1* | 1/2009 | Rengachari | G01R 33/07 324/252 |
| 2010/0187912 A1 | 7/2010 | Kitamura | |
| 2011/0018533 A1* | 1/2011 | Cesaretti | G01R 33/0035 324/251 |
| 2011/0269398 A1 | 11/2011 | Takarada | |
| 2013/0181535 A1 | 7/2013 | Muratov | |
| 2013/0241302 A1 | 9/2013 | Miyamoto | |
| 2014/0080413 A1 | 3/2014 | Hayes | |
| 2014/0145704 A1 | 5/2014 | Krapf | |
| 2014/0177197 A1 | 6/2014 | Lampinem | |
| 2015/0236526 A1 | 8/2015 | Jadidian | |
| 2015/0326056 A1 | 11/2015 | Koyanagi | |
| 2015/0326057 A1 | 11/2015 | Koyanagi | |
| 2016/0218559 A1 | 7/2016 | Mehas | |
| 2017/0093223 A1 | 3/2017 | Kai | |
| 2017/0214267 A1 | 7/2017 | Mak | |
| 2017/0229910 A1 | 8/2017 | Koyanagi | |

FOREIGN PATENT DOCUMENTS

| | | | |
|---|---|---|---|
| JP | 2015106938 A | 6/2015 | |
| JP | 2018017687 A * | 2/2018 | .............. G01R 1/22 |
| WO | 2010146662 A1 | 12/2010 | |

* cited by examiner

Vhall = Output Hall-effect voltage
H = Magnetic Flux created by magnet or current-carrying conductor
Ic = Constant supply current

FIG. 1 – Prior Art

SYSTEMS AND METHODS FOR FLUX CANCELATION IN ELECTRONIC DEVICES

CROSS-REFERENCE TO RELATED APPLICATIONS

This application is a continuation-in-part of and claims the benefit of U.S. Non-Provisional application Ser. No. 15/089,590, filed Apr. 4, 2016, which is hereby incorporated by reference, to the extent that it is not conflicting with the present application.

BACKGROUND OF INVENTION

1. Field of the Invention

The invention relates generally to electronic device charging, and more specifically to shielding of magnetic fields through cancelling of flux during electronic device charging.

2. Description of the Related Art

In a wireless charging setup, the charger is provided with a transmitter coil ("transmit coil" or "transmitter coil") Tx. The transmitter coil Tx in the charger creates a magnetic field based on the voltage and frequency impressed across the transmitter coil. The flux and flux density are dependent on the voltage across the coil, the frequency of the voltage wave, area of the cross section of the center leg, and the number of turns in the transmitter coil. The transmitter coil can be planar in structure and the lines of flux will pass through the center of this planar coil. The power is transferred when another coil known as the receiving coil (Rx) is placed within the flux field created by the transmitter coil. The coupling, which can be inductive coupling or magnetic coupling, between the two coils is through air. When the Rx coil comes within the field of the Tx coil, a current is created in the Rx coil based on the ampere times turns in the coil, where a greater number of turns of wire in the coil results in greater inductance. The ampere times turn product of the Rx coil is always equal to the ampere times turn product of the Tx coil. This current in the Rx coil can be rectified and used to charge the battery in a receiving device, such as a portable electronic device. The Rx coil is typically placed on the bottom side of the receiving electronic device, which may be a smartphone, a portable computer or a computing tablet such as the iPhone® or the iPad® or any other similar device.

When the battery of the receiving device is charged, and the receiving device is still placed on a charger mat that contains the Tx coil, the generated magnetic field can interfere with the electronics on the receiving device. This interference may cause disruptions to the proper functioning of certain electronic devices. When the receiving device is already fully charged it does not need the power transfer to charge its own battery, and the transmitting charger may still be transmitting power to other devices that may be in the vicinity. Again, this may cause disruptions to the electronic devices, or may cause erroneous behavior of the electronic devices. To shield the electronics in the receiving device or smartphone from the potentially harmful or interfering magnetic field, magnetic shields made from ferrite are often used between the Rx coil and the printed circuit board that contains the electronics in the receiving device. This magnetic shield is passive in nature and can provide a magnetic shield to the electronics. However, the effectiveness of this magnetic shield depends on the geometry of the shield and has to enclose the rest of the electronics to be truly effective. Additionally, if the receiving device is placed with the front side facing towards the Tx coil, then this magnetic shield is not able to shield the electronics after charging is complete, as the magnetic shield is no longer between the electronics of the receiving device. A system or method of active shielding may thus be needed to shield receiving devices or any other nearby devices from the magnetic field created by the Tx coil of a charger mat. Some existing systems may use a separate compensating coil to create a magnetic field for the cancellation of a transmitter coil's magnetic field, such that a three-coil structure is required (comprising the transmitter coil, the receiver coil, and the compensating coil). Such systems may require more materials and space for the compensating coil. Thus, there is a need for a solution to these problems.

The aspects or the problems and the associated solutions presented in this section could be or could have been pursued; they are not necessarily approaches that have been previously conceived or pursued. Therefore, unless otherwise indicated, it should not be assumed that any of the approaches presented in this section qualify as prior art merely by virtue of their presence in this section of the application.

BRIEF INVENTION SUMMARY

This Summary is provided to introduce a selection of concepts in a simplified form that are further described below in the Detailed Description. This Summary is not intended to identify key aspects or essential aspects of the claimed subject matter. Moreover, this Summary is not intended for use as an aid in determining the scope of the claimed subject matter.

In an aspect, a system for active shielding in an electronic device is provided, wherein a flux cancellation mode is actuated if the device is fully charged, or if the device needs to receive data, such as data from a cell tower, and is not in a charging mode, such that the electronic components of the electronic device are actively shielded from the magnetic field created by the transmitter coil of the charger mat. A control loop sources or sinks current into the receiving coil to create a flux equal in magnitude but opposite in polarity of that of the flux created by the transmitter coil of a wireless charger. A Hall effect sensor is provided, which can measure the magnitude and direction of the transmitter coil's created magnetic field, and the information is then used as an input into the control loop to ensure that the resulting net field is zero. An advantage is that interferences and disruptions to the receiving device or any other nearby devices may be minimized or removed entirely. Another advantage is that the system for creating a net zero flux is automated, such that a user does not need to manually change any settings or functions on either the wireless charging mat or the receiving device, and convenience and ease of use may be increased. Another advantage is that the system of active shielding by flux cancellation can protect an electronic device from magnetic fields from other sources as well charging devices, such as from magnetic fields created by a permanent magnet or an electromagnet. Another advantage is that an electronic device with active shielding may be able to send and receive data while it is placed on a wireless charging mat regardless of its orientation on the charging mat. Another advantage is that the receiving electronic device may be able to use the receiver coil for both the powering of the electronic device as well as for the generation of the cancellation flux when a charge is no longer needed, such that an additional coil is not necessary for this purpose or function.

In an aspect, a method of performing active shielding of components of an electronic device from a magnetic field having a first flux is provided, using a circuit comprising a Hall effect sensor; a differential amplifier; a receiving coil; a driver module having a plurality of transistors; a pulse width modulation controller or a pulse frequency modulation controller; a plurality of transistors; and an error amplifier; the method comprising the steps of: detecting when the electronic device is fully charged via a wireless charger having a transmitter coil; measuring, using the Hall effect sensor, a set of properties of the first flux generated by the transmitter coil, wherein the set of properties comprises a first magnitude and a first direction; creating an output voltage proportional to the first magnitude and the first direction; feeding the output voltage to the differential amplifier; amplifying the output voltage to create an amplified output voltage; comparing, using the error amplifier, the amplified output voltage to a reference voltage to determine an error voltage; feeding the error voltage to a pulse width modulation controller or a pulse frequency modulation controller; generating a square wave signal based on the error voltage; feeding the square wave signal as an input to a set of MOSFETs; creating, using the MOSFETs, a current based upon the input of the square wave signal, wherein the current has an amplitude equaling the first magnitude and a second direction opposite of the first direction, such that a second flux is created to cancel the first flux; and monitoring, by bidirectionally sending electronic signals between the set of MOSFETs and the Hall effect sensor, the set of properties of the first flux, such that a change in the set of properties is compensated for in the square wave signal, and the first flux is continuously canceled. Again, an advantage is that interferences and disruptions to the receiving device or any other nearby devices may be minimized or removed entirely. Another advantage is that the system for creating a net zero flux is automated, such that a user does not need to manually change any settings or functions on either the wireless charging mat or the receiving device, and convenience and ease of use may be increased. Another advantage is that the system of active shielding by flux cancellation can protect an electronic device from magnetic fields from other sources as well charging devices, such as from magnetic fields created by a permanent magnet or an electromagnet. Another advantage is that an electronic device with active shielding may be able to send and receive data while it is placed on a wireless charging mat regardless of its orientation on the charging mat. Another advantage is that the receiving electronic device may be able to use the receiver coil for both the powering of the electronic device as well as for the generation of the cancellation flux when a charge is no longer needed, such that an additional coil is not necessary for this purpose or function.

In an aspect, a method of performing active shielding of components of an electronic device from a magnetic field having a first flux is provided, using a circuit comprising a Hall effect sensor; a differential amplifier; a receiving coil; a driver module; an electric power switching circuit having a plurality of transistors; and an error amplifier; the method comprising the steps of: detecting when the electronic device is fully charged; measuring, using the Hall effect sensor, a set of properties of the first flux generated by the magnetic field, wherein the set of properties comprises a first magnitude and a first direction; creating an output voltage proportional to the first magnitude and the first direction; feeding the output voltage to the differential amplifier; amplifying the output voltage to create an amplified output voltage; comparing, using the error amplifier, the amplified output voltage to a reference voltage to determine an error voltage; feeding the error voltage to the electric power switching circuit; generating a switching waveform based on the error voltage; feeding the switching waveform as an input to the driver module; creating, using the driver module, a current based upon the input of the switching waveform, wherein the current has an amplitude equaling the first magnitude and a second direction opposite of the first direction, such that a second flux is created to cancel the first flux. Again, an advantage is that interferences and disruptions to the receiving device or any other nearby devices may be minimized or removed entirely. Another advantage is that the system for creating a net zero flux is automated, such that a user does not need to manually change any settings or functions on either the wireless charging mat or the receiving device, and convenience and ease of use may be increased. Another advantage is that the system of active shielding by flux cancellation can protect an electronic device from magnetic fields from other sources as well charging devices, such as from magnetic fields created by a permanent magnet or an electromagnet. Another advantage is that an electronic device with active shielding may be able to send and receive data while it is placed on a wireless charging mat regardless of its orientation on the charging mat. Another advantage is that the receiving electronic device may be able to use the receiver coil for both the powering of the electronic device as well as for the generation of the cancellation flux when a charge is no longer needed, such that an additional coil is not necessary for this purpose or function.

In an aspect, a circuit for active shielding of components of an electronic device from a magnetic field having a first flux is provided, the circuit comprising: a Hall effect sensor electrically connected to a differential amplifier, the Hall effect sensor being adapted to: detect when the electronic device is fully charged; sense a set of properties of the first flux, wherein the set of properties comprises a first magnitude and a first direction; and feed the first magnitude and the first direction as an input to the differential amplifier; wherein the differential amplifier is electrically connected to an electric power switching circuit, and the differential amplifier receives the input and amplifies the input into an amplified output voltage and feeds the amplified output voltage the electric power switching circuit; a receiving coil electrically connected to the Hall effect sensor; a driver module; a plurality of transistors bidirectionally sending electronic signals between the driver module and the Hall effect sensor, wherein the driver module is configured to create a current; an error amplifier electrically connected to the electric power switching circuit, wherein the error amplifier compares the amplified output voltage to a reference voltage to determine an error voltage; wherein the error voltage is used to create the current having an amplitude proportional to the first magnitude and having a second direction opposite of the first direction, such that a second flux having a second magnitude and the second direction is created to cancel the first flux; and wherein the Hall effect sensor is also adapted to monitor the set of properties of the first flux such that a change in the set of properties is compensated for in the current, and the first flux is continuously canceled. Again, an advantage is that interferences and disruptions to the receiving device or any other nearby devices may be minimized or removed entirely. Another advantage is that the system for creating a net zero flux is automated, such that a user does not need to manually change any settings or functions on either the wireless charging mat or the receiving device, and convenience and ease of use may be increased. Another advantage is that the system of active shielding by flux cancellation can protect an electronic device from magnetic fields from other sources as well charging devices, such as from magnetic fields created by a permanent magnet or an electromagnet. Another advantage is that an electronic device with active shielding may be able to send and receive data while it is placed on a wireless charging mat regardless of its orientation on the charging mat. Another advantage is that the receiving electronic device may be able to use the receiver coil for both the powering of the electronic device as well as for the generation of the cancellation flux when a charge is no longer needed, such that an additional coil is not necessary for this purpose or function.

The above aspects or examples and advantages, as well as other aspects or examples and advantages, will become apparent from the ensuing description and accompanying drawings.

BRIEF DESCRIPTION OF THE DRAWINGS

For exemplification purposes, and not for limitation purposes, aspects, embodiments or examples of the invention are illustrated in the figures of the accompanying drawings, in which.

DETAILED DESCRIPTION

Figure 1:
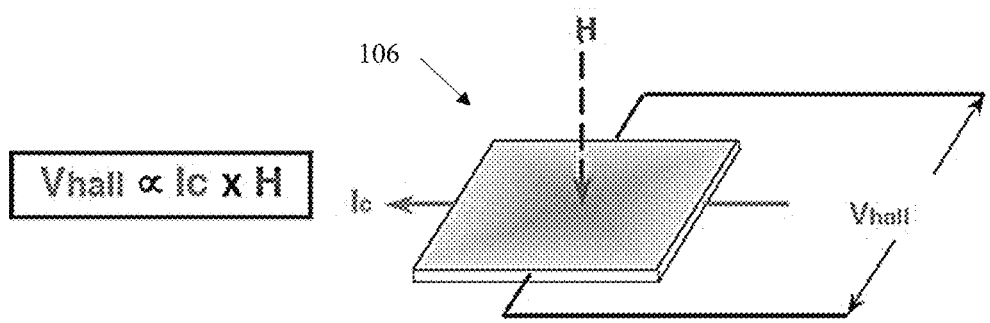
FIG. 1 illustrates a diagram of the operation of a Hall effect sensor, according to an aspect.

What follows is a description of various aspects, embodiments and/or examples in which the invention may be practiced. Reference will be made to the attached drawings, and the information included in the drawings is part of this detailed description. The aspects, embodiments and/or examples described herein are presented for exemplification purposes, and not for limitation purposes. It should be understood that structural and/or logical modifications could be made by someone of ordinary skills in the art without departing from the scope of the invention. Therefore, the scope of the invention is defined by the accompanying claims and their equivalents.

It should be understood that, for clarity of the drawings and of the specification, some or all details about some structural components or steps that are known in the art are not shown or described if they are not necessary for the invention to be understood by one of ordinary skills in the art.

As used herein and throughout this disclosure, the term "mobile device" refers to any electronic device capable of communicating across a mobile network. A mobile device may have a processor, a memory, a transceiver, an input, and an output. Examples of such devices include cellular telephones, personal digital assistants (PDAs), portable computers, etc. The memory stores applications, software, or logic. Examples of processors are computer processors (processing units), microprocessors, digital signal processors, controllers and microcontrollers, etc. Examples of device memories that may comprise logic include RAM (random access memory), flash memories, ROMS (read-only memories), EPROMS (erasable programmable read-only memories), and EEPROMS (electrically erasable programmable read-only memories). A transceiver includes but is not limited to cellular, GPRS, Bluetooth, and Wi-Fi transceivers.

"Logic" as used herein and throughout this disclosure, refers to any information having the form of instruction signals and/or data that may be applied to direct the operation of a processor. Logic may be formed from signals stored in a device memory. Software is one example of such logic. Logic may also be comprised by digital and/or analog hardware circuits, for example, hardware circuits comprising logical AND, OR, XOR, NAND, NOR, and other logical operations. Logic may be formed from combinations of software and hardware. On a network, logic may be programmed on a server, or a complex of servers. A particular logic unit is not limited to a single logical location on the network.

Mobile devices communicate with each other and with other elements via a network, for instance, a cellular network. A "network" can include broadband wide-area networks, local-area networks, and personal area networks. Communication across a network can be packet-based or use radio and frequency/amplitude modulations using appropriate analog-digital-analog converters and other elements. Examples of radio networks include GSM, CDMA, Wi-Fi and BLUETOOTH® networks, with communication being enabled by transceivers. A network typically includes a plurality of elements such as servers that host logic for performing tasks on the network. Servers may be placed at several logical points on the network. Servers may further be in communication with databases and can enable communication devices to access the contents of a database. For instance, an authentication server hosts or is in communication with a database having authentication information for users of a mobile network. A "user account" may include several attributes for a particular user, including a unique identifier of the mobile device(s) owned by the user, relationships with other users, call data records, bank account information, etc. A billing server may host a user account for the user to which value is added or removed based on the user's usage of services. One of these services includes mobile payment. In exemplary mobile payment systems, a user account hosted at a billing server is debited or credited based upon transactions performed by a user using their mobile device as a payment method.

For the following description, it can be assumed that most correspondingly labeled elements across the figures (e.g., 106 and 506, etc.) possess the same characteristics and are subject to the same structure and function. If there is a difference between correspondingly labeled elements that is not pointed out, and this difference results in a non-corresponding structure or function of an element for a particular embodiment, example or aspect, then the conflicting description given for that particular embodiment, example or aspect shall govern.

FIG. 1 illustrates a diagram of the operation of a Hall effect sensor 106, according to an aspect. The Hall effect refers to the production of a voltage difference across a conductor or semi-conductor due to the interaction of a magnetic field with the flow of current, such as a constantly supply of current as shown by $I_c$ in FIG. 1, through the conductor or semi-conductor. A Hall effect sensor may be used in any electronic device, mobile device, or any other similar device that may be a receiving device for wireless charging, for example. A Hall effect sensor is activated by an external magnetic field, which is characterized by magnetic flux H and polarity (typically denoted as north and south poles). The Hall effect sensor can generate an output voltage ("output voltage," "output," or "output Hall effect voltage") $V_{hall}$ or $V_H$ when detecting, for example, a magnetic flux H exceeding a predetermined level.

The magnitude and direction of the flux from the Tx coil may be sensed using a ratiometric linear Hall sensor, for example. This Hall sensor may create an output voltage $V_{hall}$ that is proportional to the flux density of the magnetic field that is normal or perpendicular to the Hall sensor, again, as shown in FIG. 1.

In an aspect, a flux cancellation system or system for active shielding in an electronic device is provided, wherein a flux cancellation mode ("flux cancellation mode," "cancellation mode," "flux cancel mode," or "cancel mode") is actuated if the device is fully charged, or if the device needs to receive data such as from a cell tower, and is not in a charging mode, such that the flux (denoted as Øt) transmitted by the charger mat transmitter coil is actively canceled, and such that the electronic components of the electronic device are actively shielded from the magnetic field created by the transmitter coil of the charger mat. The active shielding may be accomplished by the Rx coil being actively energized when in flux cancellation mode such that an equal amount of flux is created in the opposite direction as that of the flux from the Tx coil. The active shielding may be accomplished by using a closed loop regulation control scheme, as shown in FIGS. 2-3.

Again, the magnitude and direction of the flux from the Tx coil may be sensed using a ratiometric linear Hall sensor. This Hall sensor may create an output voltage that is proportional to the flux density of the magnetic field that is normal or perpendicular to the Hall sensor, again, as shown in FIG. 1.

Figure 2:
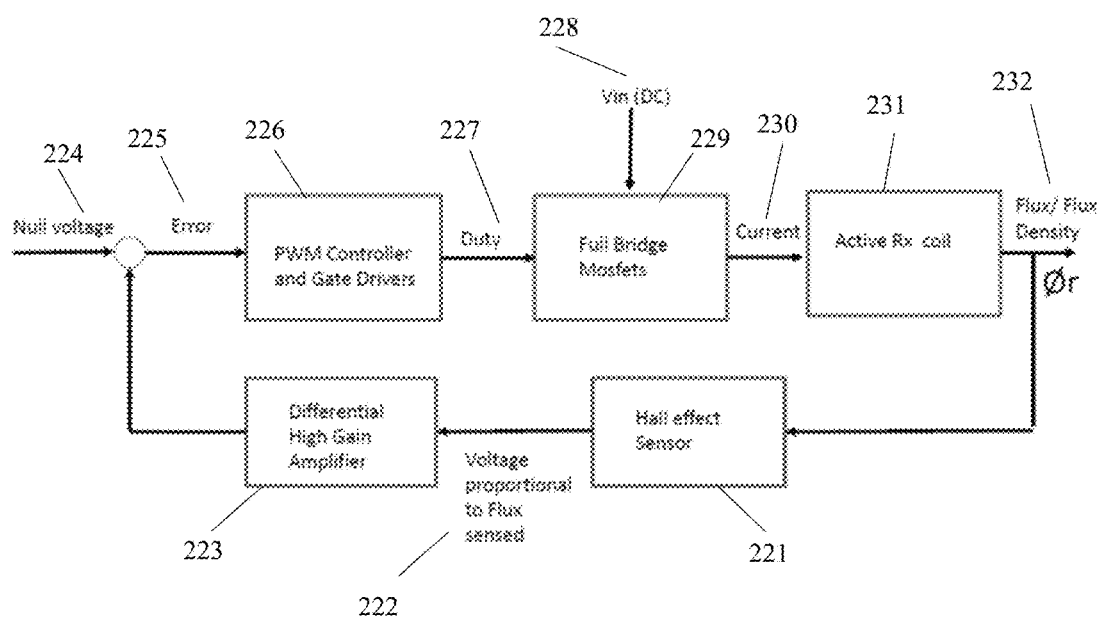
FIG. 2 illustrates a block diagram of a pulse-width modulation type control loop scheme, according to an aspect.
Figure 3:
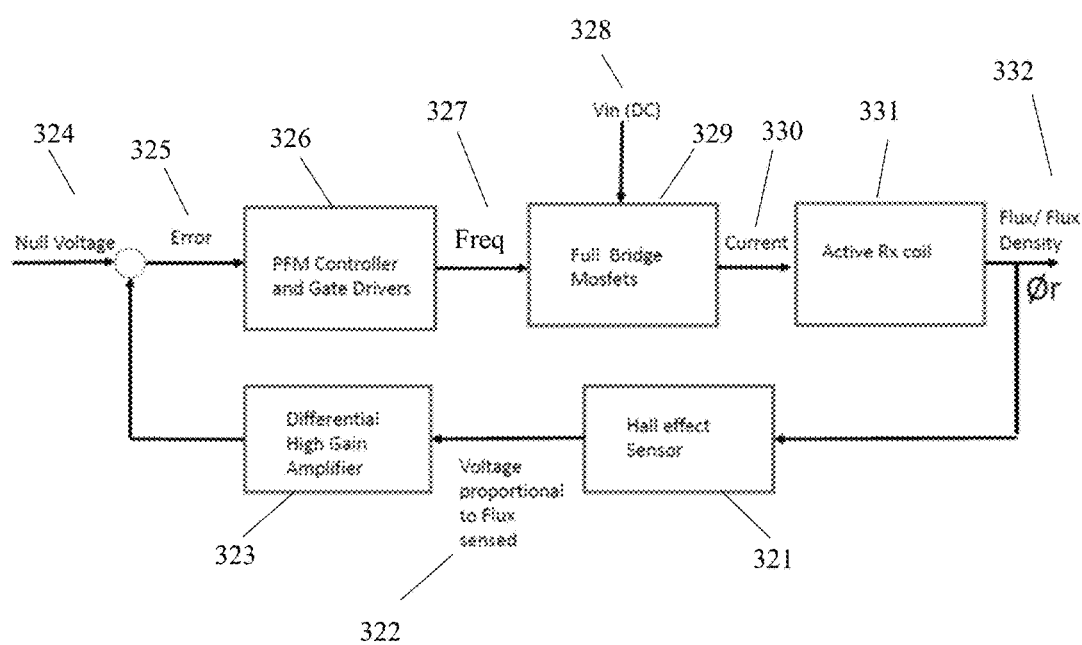
FIG. 3 illustrates a block diagram of a pulse frequency modulation type control scheme, according to an aspect.

FIG. 2 illustrates a block diagram of a pulse-width modulation (PWM) type control loop scheme that may be used with the system for active shielding, according to an aspect. An electric power switching circuit ("electric power switching circuit," or "switcher") may be used in the system for active shielding for creating a signal having the appropriate properties for the generation of a flux equal in magnitude and opposite in direction of the flux to be canceled. PWM type control may typically be used for controlling electric loads, for example. The following is an exemplary operation of the flux cancellation mode while using PWM type control, wherein a null or reference voltage is provided to the system (step 224). As an example, the electric power switching circuit may comprise power transistors such as MOSFETs, gallium nitride (GaN) MOSFETs or bipolar transistors.

While in flux cancellation mode, the Hall effect sensor senses the magnetic field within which it is located (step 221). Next, it creates an output voltage (step 222) proportional to the flux density of the magnetic field (step 232). The output voltage is fed to a differential high gain amplifier (step 223), which amplifies the voltage and feeds it to a PWM controller and gate driver stage (step 226). An error amplifier, which may be an operational amplifier (OPAMP), may be contained within the PWM controller stage, for example, and the OPAMP next compares the output of the differential high gain amplifier with a null voltage (which may be the same as a reference voltage, step 224), to determine the error voltage (step 225). As an example, steps 224 and 225 may both be performed by the OPAMP. An exemplary reference voltage is zero, and zero flux may be desired. However, it should be understood that any other small value, such as a non-zero value, may be used if a non-zero flux density is desired. Next, this error voltage is used to create a square wave signal (step 227) which has an amplitude and duty cycle that can create the desired active flux cancellation. Next, the square wave voltage signature is fed as input to full bridge MOSFETs (as will be further described in paragraph 0032, step 229). The input, which may be expressed as Vin(DC) (step 228) provides the DC power to the full bridge MOSFET stage of step 229. Next, the full bridge MOSFET stage, as commanded by the input square wave voltage signal of step 227 creates a current (step 230) which is then in the active receiver coil (step 231). The created current has an amplitude and direction that creates flux and flux density (step 232) that can cancel the flux radiating from the transmitter coil of a wireless charging mat or any other magnetic flux radiating from an electromagnet or permanent magnet, for example. The resultant net flux of step 232 is measured by the Hall effect sensor, as in step 221, to regulate the flux to the desired value of the null or reference voltage of step 224.

As an example, a servo control with PID (proportional integral derivative) as a control algorithm may be used for creating the correct magnitude and direction of the flux in the receiving coil of a receiving device for flux cancellation, and to ensure that the net resulting field is zero.

FIG. 3 illustrates a block diagram of a pulse frequency modulation (PFM) type control scheme that may be used with the system for active shielding, according to an aspect. The following is an exemplary operation of the flux cancellation mode while using PFM type control, wherein a null or reference voltage is provided to the system (step 324).

Similar to the operation of the flux cancellation mode when using PWM type control, the Hall effect sensor is used to sense the magnetic field within which it is located (step 321) while in flux cancellation mode. Next, it creates an output voltage (step 322) proportional to the flux density of the magnetic field (step 332). The output voltage is fed to a differential high gain amplifier (step 323), which amplifies the voltage and feeds it to a PFM controller and gate driver stage (step 326). An error amplifier, which may be an operational amplifier (OPAMP), may be contained within the PFM controller stage, for example, and the OPAMP next compares the output of the differential high gain amplifier with a null voltage (which may be the same as a reference voltage, step 324), to determine the error voltage (step 325). As an example, steps 224 and 225 may both be performed by the OPAMP. An exemplary reference voltage is zero, and zero flux may be desired. However, it should be understood that any other small value, such as a non-zero value, may be used if a non-zero flux density is desired. Next, this error voltage is used to create a square wave signal (step 327) which has an amplitude and frequency that can create the desired active flux cancellation. Next, the square wave voltage signature is fed as input to full bridge MOSFETs (as will be further described in paragraph 0032, step 329. The input, which may be expressed as Vin(DC) (step 328) provides the DC power to the full bridge MOSFET stage of step 329). Next, the full bridge MOSFET stage, as commanded by the input square wave voltage signal of step 327 creates a current (step 330) which is then in the active receiver coil (step 331). The created current has an amplitude and direction that creates flux and flux density (step 332) that can cancel the flux radiating from the transmitter coil of a wireless charging mat or any other magnetic flux radiating from an electromagnet or permanent magnet, for example. The resultant net flux of step 332 is measured by the Hall effect sensor, as in step 321, to regulate the flux to the desired value of the null or reference voltage of step 324.

Again, as an example, a servo control with PID (proportional integral derivative) as a control algorithm may be used for creating the correct magnitude and direction of the flux in the receiving coil of a receiving device for flux cancellation, and to ensure that the net resulting field is zero.

The Hall effect sensor output may be in millivolts (2.5-3.75 mV per Gauss), for example, and this voltage may be amplified by a differential amplifier such that the signal strength is sufficiently high enough and provides noise immunity. The signal from the differential amplifier may be compared to a zero-volt reference level by a high gain error amplifier. The reference level may be 0 mV as the goal of the control loop may be to create flux in the Rx coil, wherein the created flux is the same magnitude as that of the Tx coil, but of the opposite polarity, such that the flux from the Tx is canceled. When the flux from the Rx coil (denoted as Ør) is of the opposite polarity as that of the Tx coil, but equal in magnitude, the next flux is zero, as shown by the following exemplary expression:

$$Øt-Ør=0$$

where Øt=transmitter coil flux and Ør=receiver coil flux.

As an example, a high gain error amplifier may be used to compare or analyze the output of the differential amplifier, and may have a proportional-integral-derivative (PID) compensation scheme which may allow for optimum stability and transient response. The output of the error amplifier may then be fed to either a PWM or a PFM controller, as shown in FIGS. 2-3. In the case of a PWM controller, the pulse width may then change the pulse width. In the case of a PFM, the switching frequency may be changed. This switching waveform may then be applied to the full bridge stage using, for example, a high current gain isolated (high side/low side) drivers. The drivers used may be metal-oxide-semiconductor field-effect transistor (MOSFET, MOS-FET, or MOS FET) drivers. The switching waveform may, for example, be a square wave, and it may be applied to the full bridge power stage using the MOSFET drivers.

Figure 4:
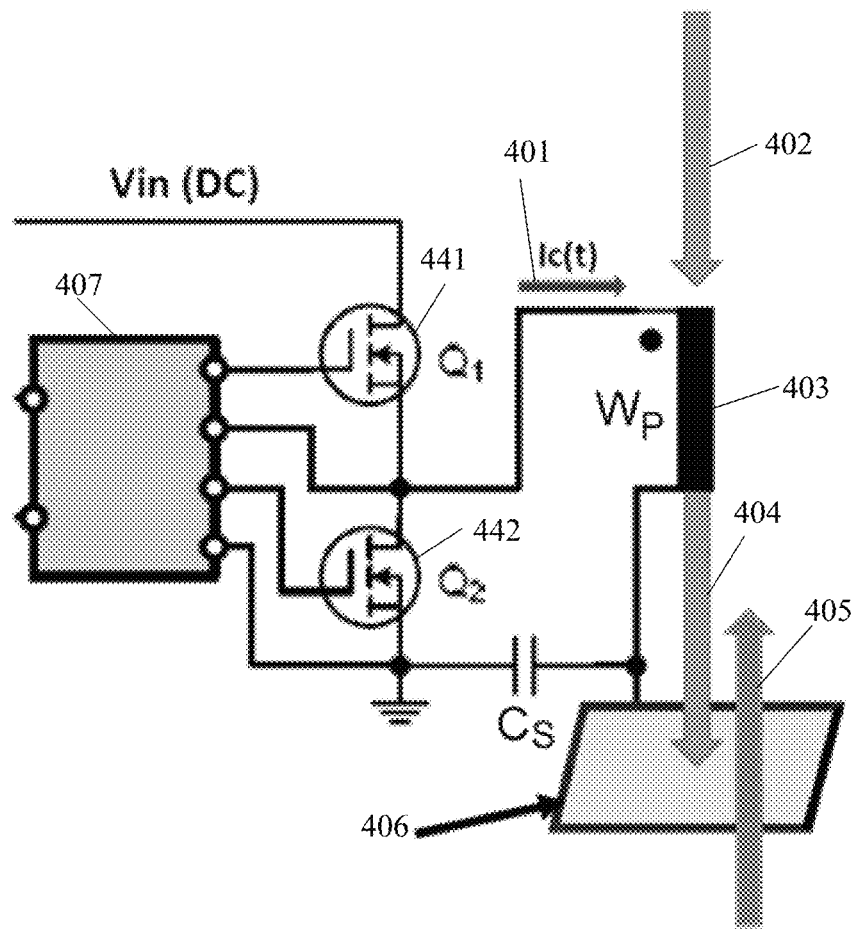
FIG. 4 illustrates a diagram showing an exemplary flux cancellation as a result of the flux created by the receiver coil, according to an aspect.

FIG. 4 illustrates a diagram showing an exemplary flux cancellation as a result of the flux created by the receiver coil, according to an aspect. As an example, the system for active shielding may be provided with the following exemplary elements. Current Ic(t) is indicated by arrow 401, wherein the magnitude and direction are regulated to achieve zero net flux. Arrow 402 refers to the flux from a compensation coil, such as a receiving coil, wherein the direction and magnitude are based on the direction and magnitude of Ic(t) 401. Arrow 403 refers to a compensating active Rx coil with an air core. Arrow 404 refers to the flux of the compensation coil (as shown as 402), which may be controlled by the flux cancellation system to equal the flux of the transmitter coil but opposite in direction, in order to create zero net flux. Arrow 405 refers to the flux of the transmitter coil from an exemplary wireless charging pad or mat (not shown). The Hall effect sensor is represented by 406, and a driver module is represented by 407 (and also shown by the transistors represented by Q1-Q4 in FIG. 6. The driver module may, for example, comprise power switching transistors that function to drive the current within the compensation coil for flux cancellation. The system for active shielding may also be provided with switching elements, which may be transistors Q1 441 and Q2 442, again, as part of the driver module. As an example, one-way diodes of an existing system within a mobile device or similar electronic device may be replaced with two-way transistors to work with the active shielding system.

The Hall effect sensor 406 may sense the magnitude and direction of the flux 405 radiating from a transmitter coil of a wireless charger, or the sensor 406 may also sense the flux of any magnetic field created by an electromagnet or permanent magnet. This sensed voltage may be fed to a differential amplifier, which may amplify this signal and feed it to a controller. The controller in the servo or the control loop of the flux cancellation circuits may then turn on transistors Q1 and Q2 (indicated by 441 and 442). The transistors Q1 441 and Q2 442 may be turned to ON or OFF in a half bridge as shown as in FIG. 4 an example. The controller in the servo or control may also turn transistors Q1, Q2, Q3, and Q4 ON or OFF in a full bridge as shown as an example in FIG. 6. The turning on or off of the transistors may cause the current Ic(t) to flow in the receiver coil (represented by Wp) 403 such that the flux 402 of the receiver coil becomes flux 404, and is equal in magnitude and opposite in direction of the flux 405 from the transmitter coil. Thus, the resultant flux passing through the electronic device (the receiving device) may be zero. The flux 402 created by the receiver coil 403 may vary with time, and may continuously vary, and thus must be monitored such that the created flux 404 cancels the flux 405 at all times. The capacitor (represented by Cs) may act as a balancing capacitor to ensure that there are no mismatches in the product of the ON time of the MOSFET drivers and the voltage applied across the receiving coil 403. As a result, this balancing capacitor may ensure that the average DC current in the receiving coil is zero, and that only AC that passes through the coil 403.

An electronic device that utilizes the active flux cancellation system may already be provided with a Hall effect sensor for various purposes such as detection of a magnetic protective cover. As an example, an electronic device being used as a receiving device in a wireless charging system may utilize the existing Hall effect sensor for the active flux cancellation system (as shown by 406 in FIG. 4). An advantage may be that the Hall effect sensor serving multiple purposes may reduce the need for space in the device and allow for a thinner or lighter device, and may also reduce the amount of materials needed for construction of the device. As another example, an electronic device being used as a receiving device in a wireless charging system may be provided with a Hall effect sensor for any suitable purpose, and may also be provided with a second Hall effect sensor for use in the active flux cancellation system (again, as shown by 406 in FIG. 4). Similarly, an electronic device being used as a receiving device in a wireless charging system may be provided without any Hall effect sensor for other purposes, and may thus be incorporated with a dedicated Hall effect sensor for use within the system for active shielding.

When a single Hall effect sensor within an electronic device is used within the system for active shielding, as well as other purposes for the electronic device, an advantage may be that the space may be saved in the electronic device and less components and materials may be needed for the construction of the device. Another advantage is that existing components may be used for performing active shielding. Another advantage is that no new components may need to be added or very few additional components may need to be added or replaced in an electronic device in order for the device to utilize the system for active shielding. Again, as an example, elements such as MOSFET drivers, PWM or PFM controllers, receiving coils, and Hall effect sensors may typically be in use in existing electronic devices or wireless chargers, and a dual usage for some of the above elements may be achieved through modification of the direction and magnitude of the current in the receiving coil, such as, for example, by replacement of diodes within an electronic device with transistors. Another advantage of the system for active shielding may be that the system may eliminate the need for a passive shielding in an electronic device, which may help to reduce the size, materials, and cost of electronic devices that work with a wireless charger.

Figure 5:
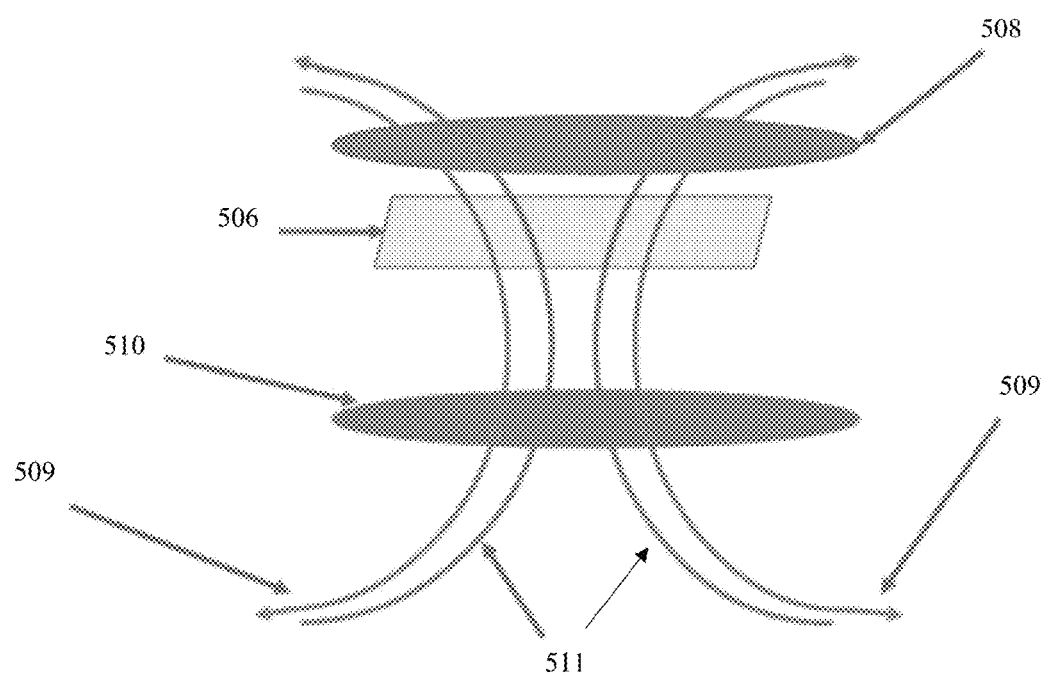
FIG. 5 illustrates the flux cancellation due to the flux created by the receiving coil Rx, according to an aspect.

FIG. 5 illustrates the flux cancellation due to the flux created by the receiving coil Rx, according to an aspect. As shown as an example, the Hall effect sensor 506 may be located underneath the plane of the active receiving coil 508. The transmitter coil 510, which may be within a charging mat, may then be located underneath the sensor 506 when the system is in use, for example. The direction of the Rx coil flux, represented by arrows 509, may be in null flux mode which is equal in magnitude but opposite in direction of the flux 511 from the Tx coil 510.

Figure 6:
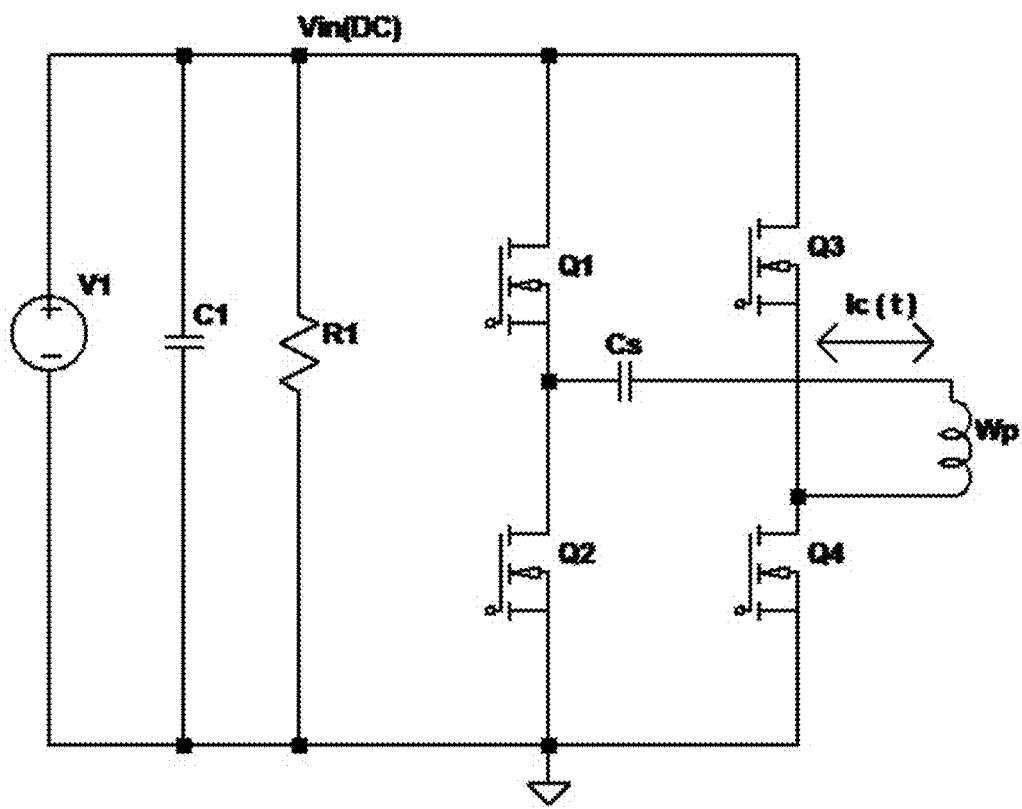
FIG. 6 illustrates a diagram showing the power stage of an exemplary circuit that may drive the receiving coil, according to an aspect.

FIG. 6 illustrates a diagram showing the power stage of an exemplary circuit that may drive the receiving coil, according to an aspect. FIG. 6 thus illustrates an example of the full bridge power stage driving the active Rx coil (as represented by Wp) when wireless power transfer is not required by the receiving device. As an example, when the Rx coil is not being driven by the power stage MOSFET drivers during flux cancellation mode, the MOSFETS shown as M1-M4 as an example in FIG. 6 may be used to rectify the current that is created in the Rx coil during the charging mode.

As shown in FIG. 6, the full bridge power stage may drive the receiver coil such that the flux Ør created by the receiver coil is of equal magnitude to the flux Øt of the transmitter coil, but in the opposite polarity or direction. The Hall effect sensor may be located below the receiver coil. If the net flux passing through the Hall effect sensor is zero, then the error in the regulation loop may be minimized, and a steady state condition may be reached. Until this condition is reached, the loop may continue to change the duty or the switching frequency in order to change the magnitude and direction of the current in the Rx coil, such that the flux Ør is equal and opposite to the flux Øt, as shown in FIGS. 4-5.

It should be understood that while the focus in the disclosure is on the configuration of a wireless charging system provided in a charging mat, a wireless charging system may be provided in any suitable configuration. For example, a surface of a desk, table, or similar article may be provided with a transmitter coil to provide wireless charging to a suitable receiving device having a receiving coil.

It should also be understood that while the focus in the disclosure is on the receiving device being a smart phone, a tablet, or other similar article, the receiving device may be any suitable device having a receiving coil that may use wireless charging. It should also be understood that the systems and methods of flux cancellation described herein to create an active shielding from a magnetic field may be applied to any electronic circuit or device containing electronic components, such as smart watches, cars, or any other apparatus.

It may be advantageous to set forth definitions of certain words and phrases used in this patent document. The term "couple" and its derivatives refer to any direct or indirect communication between two or more elements, whether or not those elements are in physical contact with one another. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Further, as used in this application, "plurality" means two or more. A "set" of items may include one or more of such items. Whether in the written description or the claims, the terms "comprising," "including," "carrying," "having," "containing," "involving," and the like are to be understood to be open-ended, i.e., to mean including but not limited to. Only the transitional phrases "consisting of" and "consisting essentially of," respectively, are closed or semi-closed transitional phrases with respect to claims.

If present, use of ordinal terms such as "first," "second," "third," etc., in the claims to modify a claim element does not by itself connote any priority, precedence or order of one claim element over another or the temporal order in which acts of a method are performed. These terms are used merely as labels to distinguish one claim element having a certain name from another element having a same name (but for use of the ordinal term) to distinguish the claim elements. As used in this application, "and/or" means that the listed items are alternatives, but the alternatives also include any combination of the listed items.

Throughout this description, the aspects, embodiments or examples shown should be considered as exemplars, rather than limitations on the apparatus or procedures disclosed or claimed. Although some of the examples may involve specific combinations of method acts or system elements, it should be understood that those acts and those elements may be combined in other ways to accomplish the same objectives.

Acts, elements and features discussed only in connection with one aspect, embodiment or example are not intended to be excluded from a similar role(s) in other aspects, embodiments or examples.

Aspects, embodiments or examples of the invention may be described as processes, which are usually depicted using a flowchart, a flow diagram, a structure diagram, or a block diagram. Although a flowchart may depict the operations as a sequential process, many of the operations can be performed in parallel or concurrently. In addition, the order of the operations may be re-arranged. With regard to flowcharts, it should be understood that additional and fewer steps may be taken, and the steps as shown may be combined or further refined to achieve the described methods.

If means-plus-function limitations are recited in the claims, the means are not intended to be limited to the means disclosed in this application for performing the recited function, but are intended to cover in scope any equivalent means, known now or later developed, for performing the recited function.

If any presented, the claims directed to a method and/or process should not be limited to the performance of their steps in the order written, and one skilled in the art can readily appreciate that the sequences may be varied and still remain within the spirit and scope of the present invention.

Although aspects, embodiments and/or examples have been illustrated and described herein, someone of ordinary skills in the art will easily detect alternate of the same and/or equivalent variations, which may be capable of achieving the same results, and which may be substituted for the aspects, embodiments and/or examples illustrated and described herein, without departing from the scope of the invention. Therefore, the scope of this application is intended to cover such alternate aspects, embodiments and/or examples. Hence, the scope of the invention is defined by the accompanying claims and their equivalents. Further, each and every claim is incorporated as further disclosure into the specification.

What is claimed is:

1. A method of performing active shielding of components of an electronic device from a magnetic field having a first flux, using a circuit comprising a Hall effect sensor; a differential amplifier; a receiving coil; a driver module having a plurality of transistors; a pulse width modulation controller or a pulse frequency modulation controller; a plurality of transistors; and an error amplifier;

the method comprising the steps of:
detecting when the electronic device is fully charged via a wireless charger having a transmitter coil;
measuring, using the Hall effect sensor, a set of properties of the first flux generated by the transmitter coil, wherein the set of properties comprises a first magnitude and a first direction;
creating an output voltage proportional to the first magnitude and the first direction;
feeding the output voltage to the differential amplifier;
amplifying the output voltage to create an amplified output voltage;
comparing, using the error amplifier, the amplified output voltage to a reference voltage to determine an error voltage;
feeding the error voltage to a pulse width modulation controller or a pulse frequency modulation controller;
generating a square wave signal based on the error voltage;
feeding the square wave signal as an input to a set of MOSFETs;
creating, using the MOSFETs, a current based upon the input of the square wave signal, wherein the current has an amplitude equaling the first magnitude and a second direction opposite of the first direction, such that a second flux is created to cancel the first flux; and
monitoring, by bidirectionally sending electronic signals between the set of MOSFETs and the Hall effect sensor, the set of properties of the first flux, such that a change in the set of properties is compensated for in the square wave signal, and the first flux is continuously canceled.

2. The method of claim 1, wherein the reference voltage is zero.

3. The method of claim 1, wherein the second flux is created in the receiving coil of the electronic device.

4. The method of claim 1, wherein the receiving coil is an air coil.

5. The method of claim 1, wherein the plurality of transistors comprises two transistors.

6. The method of claim 1, wherein the plurality of transistors comprises four transistors.

7. A method of performing active shielding of components of an electronic device from a magnetic field having a first flux, using a circuit comprising a Hall effect sensor; a differential amplifier; a receiving coil; a driver module; an electric power switching circuit having a plurality of transistors; and an error amplifier;

the method comprising the steps of:
detecting when the electronic device is fully charged;
measuring, using the Hall effect sensor, a set of properties of the first flux generated by the magnetic field, wherein the set of properties comprises a first magnitude and a first direction;
creating an output voltage proportional to the first magnitude and the first direction;
feeding the output voltage to the differential amplifier;
amplifying the output voltage to create an amplified output voltage;
comparing, using the error amplifier, the amplified output voltage to a reference voltage to determine an error voltage;
feeding the error voltage to the electric power switching circuit;
generating a switching waveform based on the error voltage;
feeding the switching waveform as an input to the driver module;
creating, using the driver module, a current based upon the input of the switching waveform, wherein the current has an amplitude equaling the first magnitude and a second direction opposite of the first direction, such that a second flux is created to cancel the first flux.

8. The method of claim 7, wherein the switching waveform is a square wave signal.

9. The method of claim 7, the circuit further comprising a plurality of transistors, and the method further comprising the step of:
monitoring, by bidirectionally sending electronic signals between the driver module and the Hall effect sensor, the set of properties of the first flux, such that a change in the set of properties is compensated for in the square wave signal, and the first flux is continuously canceled.

10. The method of claim 7, wherein the reference voltage is non-zero.

11. The method of claim 7, wherein the driver module comprises MOSFETs.

12. The method of claim 7, wherein the electric power switching circuit is a pulse width modulation type controller.

13. The method of claim 7, wherein the electric power switching circuit is a pulse frequency modulation type controller.

14. The method of claim 7, wherein the plurality of transistors comprises two transistors.

15. The method of claim 7, wherein the plurality of transistors comprises four transistors.

16. A circuit for active shielding of components of an electronic device from a magnetic field having a first flux, the circuit comprising:
a Hall effect sensor electrically connected to a differential amplifier, the Hall effect sensor being adapted to:
detect when the electronic device is fully charged;
sense a set of properties of the first flux, wherein the set of properties comprises a first magnitude and a first direction; and
feed the first magnitude and the first direction as an input to the differential amplifier;
wherein the differential amplifier is electrically connected to an electric power switching circuit, and the differential amplifier receives the input and amplifies the input into an amplified output voltage and feeds the amplified output voltage the electric power switching circuit;
a receiving coil electrically connected to the Hall effect sensor;
a driver module;

a plurality of transistors bidirectionally sending electronic signals between the driver module and the Hall effect sensor, wherein the driver module is configured to create a current;

an error amplifier electrically connected to the electric power switching circuit, wherein the error amplifier compares the amplified output voltage to a reference voltage to determine an error voltage;

wherein the error voltage is used to create the current having an amplitude proportional to the first magnitude and having a second direction opposite of the first direction, such that a second flux having a second magnitude and the second direction is created to cancel the first flux; and wherein the Hall effect sensor is also adapted to monitor the set of properties of the first flux such that a change in the set of properties is compensated for in the current, and the first flux is continuously canceled.

17. The circuit of claim 16, wherein the electric power switching circuit is a pulse width modulation type controller.

18. The circuit of claim 16, wherein the electric power switching circuit is a pulse frequency modulation type controller.

19. The circuit of claim 16, wherein the plurality of transistors comprises two transistors.

20. The circuit of claim 16, wherein the plurality of transistors comprises four transistors.

\* \* \* \* \*